US012566481B2

(12) United States Patent
Chialastri et al.

(10) Patent No.: US 12,566,481 B2
(45) Date of Patent: Mar. 3, 2026

(54) PORTABLE MAINTENANCE CDU AND MAINTENANCE PORTS FOR SUPPLYING LIQUID COOLANT DURING PRIMARY CDU DOWNTIME

(71) Applicant: HEWLETT PACKARD ENTERPRISE DEVELOPMENT LP, Spring, TX (US)

(72) Inventors: David Scott Chialastri, Montgomery, TX (US); Pranay Mahendra, Tomball, TX (US); Arthur Volkmann, Spring, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 483 days.

(21) Appl. No.: 18/161,935

(22) Filed: Jan. 31, 2023

(65) Prior Publication Data

US 2024/0256016 A1     Aug. 1, 2024

(51) Int. Cl.
    *G06F 1/20*        (2006.01)
    *H05K 7/20*       (2006.01)

(52) U.S. Cl.
    CPC ......... *G06F 1/206* (2013.01); *H05K 7/20272* (2013.01); *H05K 7/20281* (2013.01)

(58) Field of Classification Search
    CPC ........... H05K 7/20272; H05K 7/20281; H05K 7/20763; H05K 7/20772; H05K 7/20781; H05K 7/2079; H05K 7/20709; G06F 1/20; G06F 1/206; G06F 2200/201
See application file for complete search history.

(56) References Cited

U.S. PATENT DOCUMENTS

| | | | |
|---|---|---|---|
| 8,297,069 B2 | 10/2012 | Novotny et al. | |
| 10,602,640 B1 * | 3/2020 | Tsai ................... | H05K 7/20254 |
| 10,667,437 B2 | 5/2020 | Gao | |
| 2010/0236772 A1 * | 9/2010 | Novotny ........... | H05K 7/20836 |
| | | | 165/287 |
| 2012/0281358 A1 * | 11/2012 | Chainer ............. | H05K 7/20781 |
| | | | 361/699 |
| 2012/0281359 A1 * | 11/2012 | Arney ................ | H05K 7/20645 |
| | | | 29/428 |
| 2016/0066480 A1 * | 3/2016 | Eckberg .................. | F16L 37/34 |
| | | | 361/679.53 |
| 2017/0127576 A1 * | 5/2017 | Campbell ........... | H05K 7/2039 |

(Continued)

OTHER PUBLICATIONS

IBM, "Rear Door Heat exchanger V2, Type 1756," Installation & Maintenance Guide, Fourth Edition, Sep. 2013, 104 pages.

*Primary Examiner* — Adam B Dravininkas
(74) *Attorney, Agent, or Firm* — Jones Robb PLLC

(57)        ABSTRACT

A system may comprise one or more computing systems, each comprising a group of compute nodes configured to receive liquid coolant. The system also comprises a primary coolant distribution unit (CDU) fluidically coupled to the computing system via a first set of fluid couplings and configured to supply the liquid coolant to the computing system. The system also includes a portable maintenance CDU configured to be removably coupled to the computing system, in a state of the primary CDU still being coupled to the computing system, via a second set of fluid couplings. The maintenance CDU is configured to supply the liquid coolant to the computing system in an installed state in lieu of the primary CDU.

20 Claims, 9 Drawing Sheets

(56)     References Cited

U.S. PATENT DOCUMENTS

| 2017/0303439 | A1* | 10/2017 | Cader | ............... | H05K 7/20836 |
| 2019/0182988 | A1* | 6/2019 | Lunsman | ........... | H05K 7/20281 |
| 2021/0274687 | A1 | 9/2021 | Chen et al. | | |
| 2021/0378149 | A1 | 12/2021 | Gao | | |
| 2022/0240421 | A1* | 7/2022 | Zhang | ............... | H05K 7/20772 |
| 2022/0346271 | A1* | 10/2022 | Chen | ................. | H05K 7/20763 |

* cited by examiner

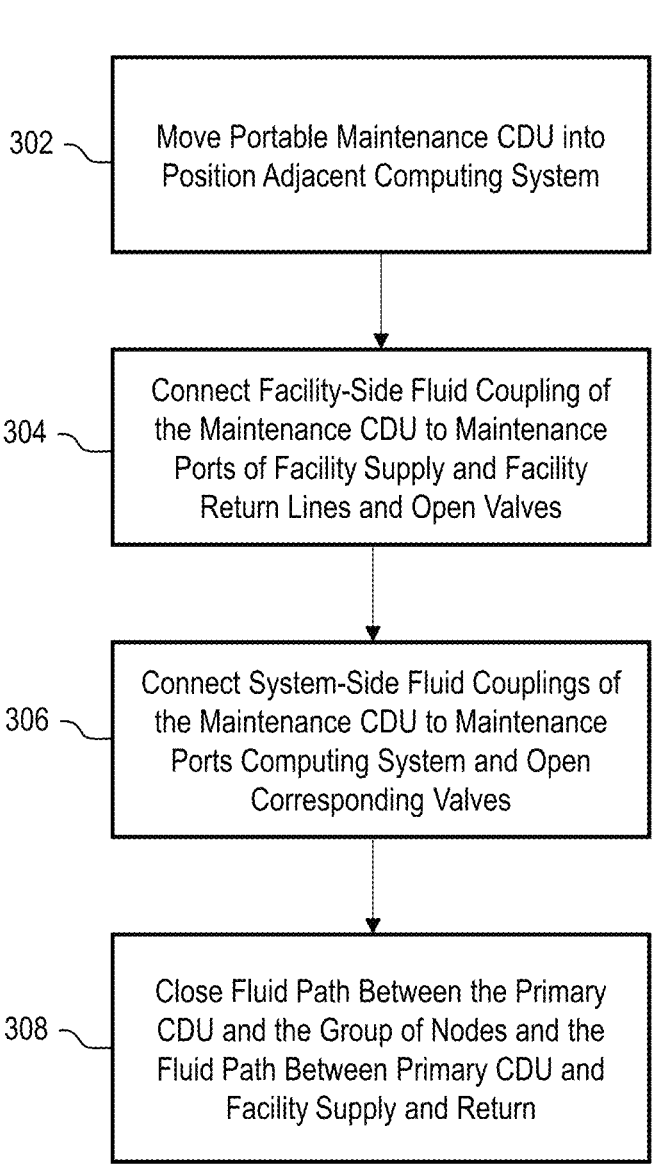

302 ⟍  Move Portable Maintenance CDU into Position Adjacent Computing System

304 ⟍  Connect Facility-Side Fluid Coupling of the Maintenance CDU to Maintenance Ports of Facility Supply and Facility Return Lines and Open Valves 306 ⟍  Connect System-Side Fluid Couplings of the Maintenance CDU to Maintenance Ports Computing System and Open Corresponding Valves 308 ⟍  Close Fluid Path Between the Primary CDU and the Group of Nodes and the Fluid Path Between Primary CDU and Facility Supply and Return

PORTABLE MAINTENANCE CDU AND MAINTENANCE PORTS FOR SUPPLYING LIQUID COOLANT DURING PRIMARY CDU DOWNTIME

INTRODUCTION

Electronic devices, such as computers, networking devices, power supply units, etc., generate heat when in use. Cooling systems may be utilized to remove heat from components of the electronic devices to keep them within desired operating temperatures. For example, liquid cooling techniques may use flows of liquid coolant to remove heat from the system. In such liquid cooling techniques, a cold plate thermally coupled with the electronic device and the flow of liquid coolant can be used to transfer heat from the electronic device to the liquid coolant.

In systems that utilize liquid cooling techniques, the flows of liquid coolant are delivered to the electronic devices via liquid cooling infrastructure such as pumps, coolant lines, fluid couplings, etc. In particular, in some systems with large scale deployments of electronic devices (e.g., datacenters), coolant distribution units (CDUs) may be used to provide the flows of liquid coolant to groups of electronic devices. For example, each CDU may be provided for a defined group of racks or cabinets (which may comprise one rack/cabinet or multiple racks/cabinets), and the CDU may distribute liquid coolant to the multiple electronic devices contained within the corresponding rack(s)/cabinet(s). The CDU may comprise one or more pumps that generate the flows of liquid coolant, which flow in a loop from the CDU to the electronic devices and then back to the CDU. In addition, the CDU may comprise a heat exchanger arranged to cool the liquid coolant by transferring heat from the liquid coolant to another cooling medium, such as a facility-wide cooling medium. In this way, the liquid coolant provided by the CDU to the electronic devices can be relatively cool (thus allowing for more efficient heat removal from electronic devices), the coolant is then heated by the electronic devices and the heated liquid coolant is returned to the CDU, and then the CDU cools the heated liquid coolant and supplies the now-cooled liquid coolant back to the electronic device for another cycle. The facility-wide cooling medium that removes the heat from the liquid coolant in the CDU may be air (e.g., the CDU may comprise a liquid-to-air heat exchanger, such as a radiator) or liquid (e.g., the CDU may comprise a liquid-to-liquid heat exchanger).

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

Figure 1A:
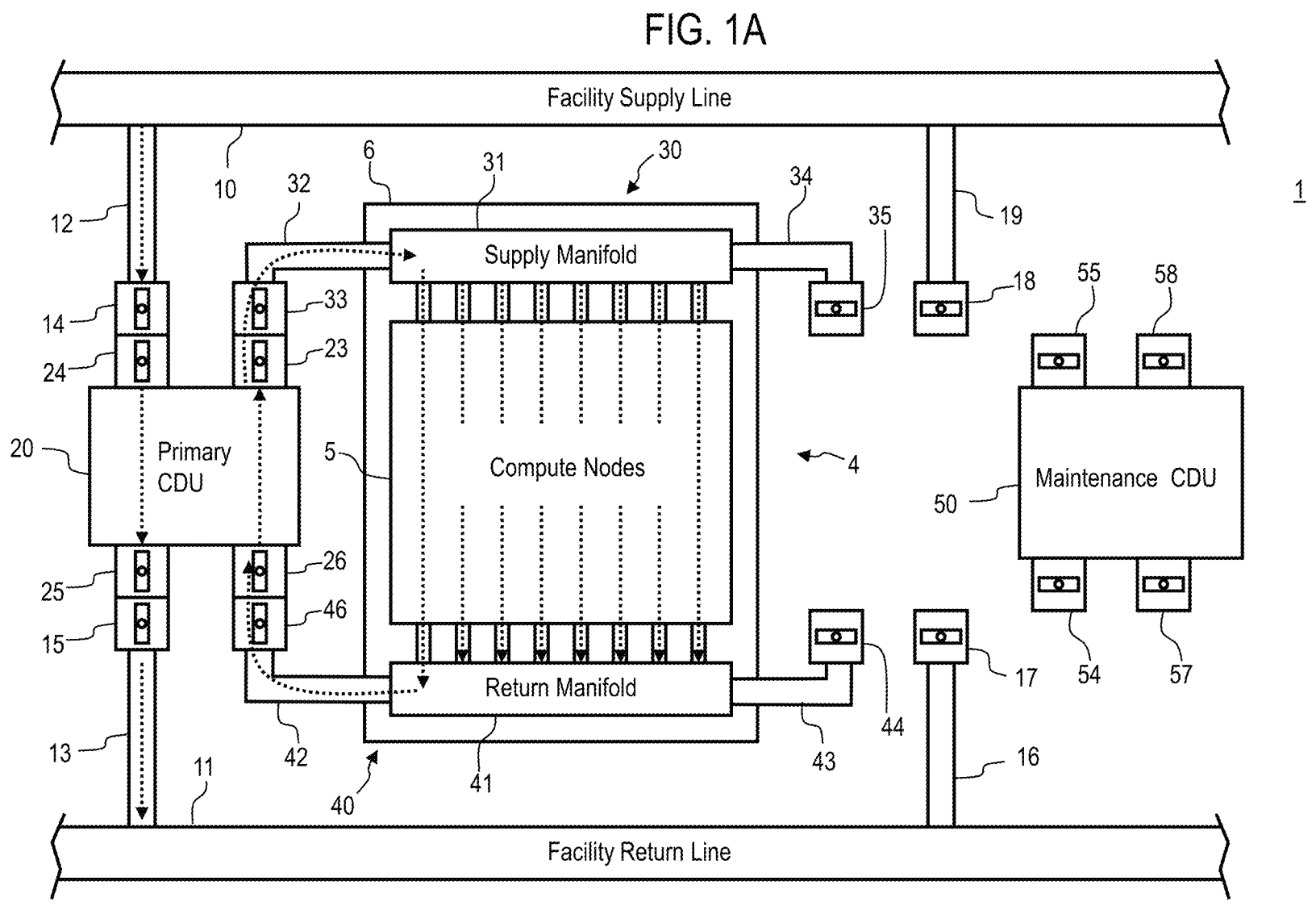

FIG. 1A is a block diagram illustrating an example system in a first state.

FIG. 1C is a block diagram illustrating the example system in a third state.

FIG. 1D is a block diagram illustrating the example system in a fourth state.

FIG. 1F is a block diagram illustrating the example system in a sixth state.

FIG. 3 is a process flow diagram illustrating an example method.

DETAILED DESCRIPTION

Figure 1B:
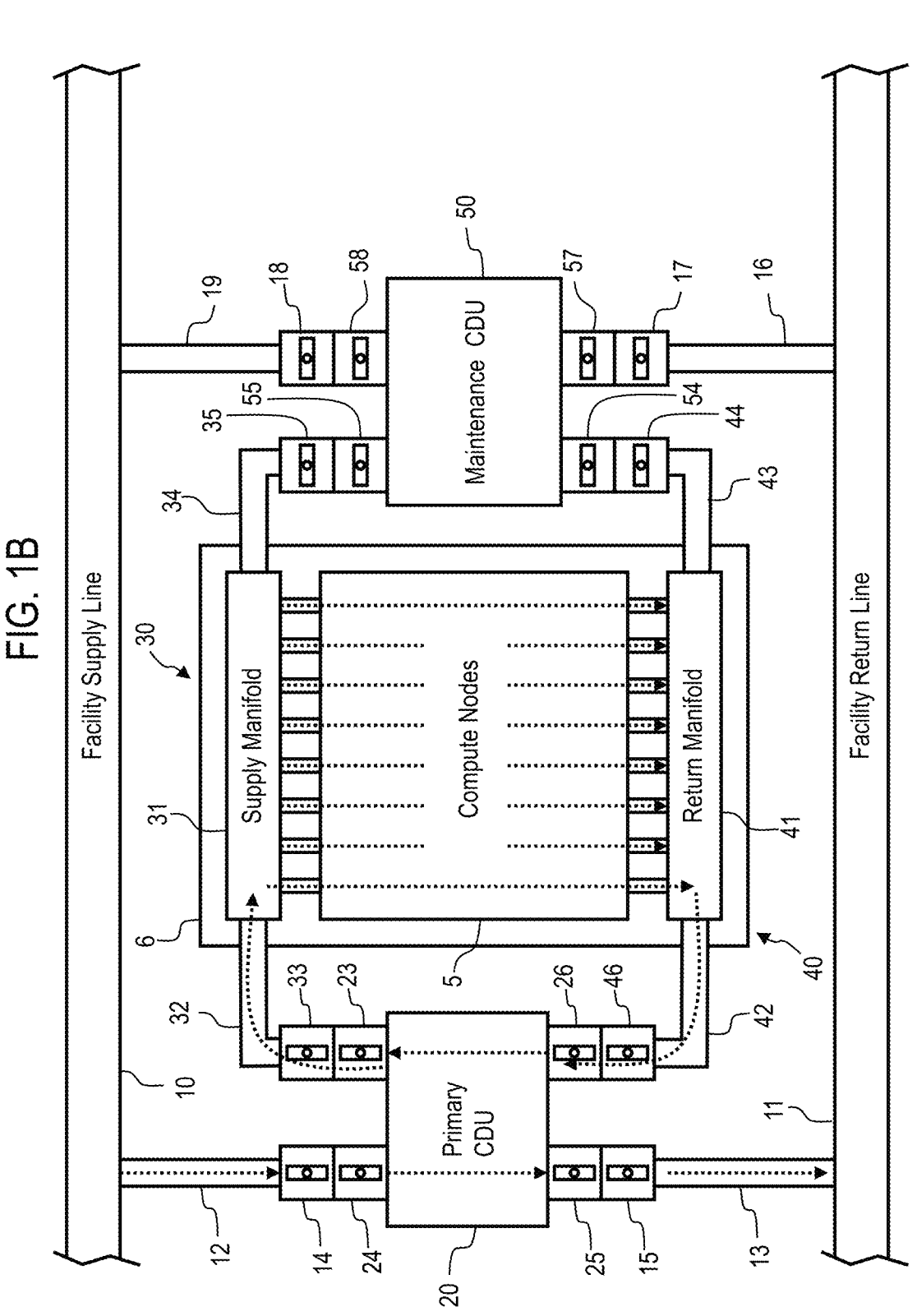
FIG. 1B is a block diagram illustrating the example system in a second state.

CDU's may benefit from occasional maintenance that may require the CDU to be taken offline temporarily. Moreover, CDU's, like any other device, can experience failures that cause the CDU to cease functioning until repaired or replaced. Moreover, even if a failure is more minor and does not cause the CDU to completely cease functioning, the repairs to correct the failure may themselves require the CDU to be taken offline for the duration of the repair. Thus, for these and other reasons, it can be expected that a CDU will occasionally experience downtime (whether planned or unplanned). However, such downtime for a CDU can be very costly and/or inconvenient. The cost and inconvenience are attributable not only to the direct costs to repairing/ replacing the CDU, but even more so to the fact that when the CDU is taken offline, this may necessitate all of the many electronic devices serviced thereby—e.g., an entire rack or multiple racks—also being turned off until the CDU can resume operation or be replaced. While CDU's may have some redundant parts, such as redundant pumps, to reduce downtime, it is generally cost prohibitive to make all of the parts of the CDU redundant, and thus planned and unplanned downtime for the CDU generally cannot be avoided entirely.

To address these and other issues, examples described herein utilize a portable maintenance CDU to temporarily perform the functions of a primary CDU while the primary CDU is offline, such as for maintenance, repair, or replacement. When the primary CDU is offline (for planned or unplanned downtime), the maintenance CDU is moved into position near the group of electronic devices and is temporarily fluidically coupled to the group of electronic devices (e.g., the one or more racks) that would normally be serviced by the primary CDU. Once so connected, the maintenance CDU may pump the liquid coolant to the electronic devices in lieu of the primary CDU. Moreover, the maintenance CDU is also coupled to the facility cooling medium, and thus the maintenance CDU can remove heat from the liquid coolant in lieu of the primary CDU. Thus, the maintenance CDU can perform the functions of the primary CDU and continue to supply cooling capacity to the electronic devices despite the primary CDU being offline, which allows the group of electronic devices to remain on during the downtime of the primary CDU.

The maintenance CDU is fluidically coupled to the group of electronic devices via maintenance ports that are built into the liquid cooling infrastructure associated with the group of electronic devices. These maintenance ports may comprise, for example, quick disconnect fluid couplings that are configured to mate with corresponding fluid couplings on the maintenance CDU. The maintenance ports may, for example, be coupled (directly or indirectly) to a supply manifold that supplies liquid coolant to the group of electronic devices and to a return manifold that returns liquid coolant from the group of electronic devices.

Because the maintenance CDU is portable and not permanently connected to any group of electronic devices, the maintenance CDU is not limited to servicing just one specific group of electronic devices (e.g., one rack or group of racks) and can instead be used with multiple groups of electronic devices having multiple respective primary CDUs. In other words, in a large-scale deployment with multiple CDUs servicing multiple groups of electronic devices, the maintenance CDU can be moved from one of the groups to another as needed to temporarily provide support thereto while the respective primary CDUs of those groups experience planned or unplanned downtime. Because unplanned downtime (e.g., failure) of a CDU is relatively rare, and because planned downtime (e.g., maintenance) of CDUs can generally be scheduled so as to avoid overlaps, it would be relatively rare for more than one CDU to be down simultaneously, and even rarer for more than two CDUs to be down simultaneously. Thus, even in a large-scale deployment with multiple primary CDUs, the number of maintenance CDUs that may be needed may be relatively small—in some cases, a single maintenance CDU could be sufficient for an entire data center.

This is in contrast, for example, to an approach of providing a permanently installed redundant CDU for each of the primary CDUs. While such redundancy would reduce the risk of electronic devices being turned off due to primary CDU downtime, the costs of providing a permanent redundant CDU for each primary CDU would be very high. Moreover, any given redundant CDU may be utilized relatively infrequently (as planned or unplanned downtime of any given CDU is infrequent), and thus the cost-per-use of each individual redundant CDU may be relatively high. In contrast, the overall costs of providing the maintenance CDUs may be relatively lower, since only one or a few maintenance CDUs may be needed even for a large scale deployment. Moreover, a given maintenance CDU may be utilized relatively frequently (as compared to a redundant CDU) because the maintenance CDU may be used to support multiple primary CDUs, and thus the cost-per-use associated with a given maintenance CDU may be much lower.

These and other examples will be described in greater detail below in relation to FIGS. 1A-3.

FIGS. 1A-1G illustrate an example system 1 in various states. FIGS. 1A-1G may also be referred to collectively herein as FIG. 1, or individually as FIG. 1A, FIG. 1B, and so on.

As shown in FIG. 1, the system 1 comprises one or more computing systems 4, one or more primary CDUs 20 (one per computing system 6), and a maintenance CDU 50. The computing system 6 comprises a group of compute nodes 5, a local liquid cooling supply path 30, and a local liquid cooling return path 40. For example, the computing system 6 may comprise a rack, cabinet, or housing, or group of multiple racks, cabinets, or housings, that house the group of compute nodes 5. The compute nodes 5 may comprise servers, for example, that are configured for liquid cooling. The liquid cooling may be provided to the compute nodes 5 by liquid cooling infrastructure comprising a primary CDU 20, as well as the aforementioned supply path 30 and return path 40. The computing system 6 may also comprise other devices (not illustrated), such as networking devices, power supply devices, and other devices, as would be familiar to those of ordinary skill in the art, and in some examples these other devices may also be liquid cooled by the liquid coolant supplied from the aforementioned liquid cooling infrastructure.

The primary CDU 20 is coupled to the computing system 6 via a first set of fluid couplings 23, 26, 33, and 46. Specifically, the primary CDU 20 is coupled to local supply path 30 via one or more fluid couplings 23 and 33 and to the local return path 40 via one or more fluid couplings 26 and 46. This is the case both in examples in which the primary CDU 20 has a liquid-to-liquid heat exchanger and in examples in which the primary CDU 20 has a liquid-to-air heat exchanger. The local supply path 30 may comprise, for example, a supply manifold 31, which receives cooled liquid coolant from the CDU 20 and has a plurality of ports to supply the liquid to the various compute nodes 5 or other devices respectively coupled to the ports. The local supply path 30 may also comprise one or more pipes or tubes 32 that extend between the primary CDU 20 and the supply manifold 31. Similarly, the local return path 40 may comprise, for example, a return manifold 41, which receives heated liquid coolant from the compute nodes 5 via a number of ports and returns the heated liquid to the primary CDU 20. The local return path 40 may also comprise one or more pipes or tubes 42 that extend between the primary CDU 20 and the return manifold 41. Fluid coupling 33 is connected to supply manifold 31 (e.g., directly or via intermediate pipe or tubing 32), fluid coupling 23 is connect to primary CDU 20 (e.g., directly or via an intermediate pipe or tubing (not illustrated)), and the fluid couplings 33 and 23 are coupled together. Similarly, fluid coupling 46 is connected to return manifold 41 (e.g., directly or via intermediate pipe or tubing 42), fluid coupling 26 is connect to primary CDU 20 (e.g., directly or via an intermediate pipe or tubing (not illustrated)), and the fluid couplings 26 and 46 are coupled together. Fluid couplings 23 and 26 are fluidically coupled to one another via a second flow path through the primary CDU 20, which extends through a second side of the heat exchanger thereof. Thus, when connectors 23 and 33 and connectors 26 and 46 are connected (and flow controls are open) a flow path is formed from local return path 40 to local supply path 30 through the heat exchanger of the primary CDU 20.

In some examples, the fluid couplings 23, 26, 33, and 46 comprise quick-disconnect couplers that allow for easier removal of the primary CDU 20 (e.g., if the primary CDU needs replacement). In other examples, the fluid coupling 23, 26, 33, and 46 may be more permanent couplings. Any type of fluid coupling mechanism may be used. Valves or other flow control mechanisms may also be provided in the flow path; for example, in FIG. 1, the fluid couplings 23, 26, 33, and 46 themselves have integral flow control mechanisms that can stop fluid movement, for example to prevent flow when they are disconnected. Integral in this context refers to the flow control mechanism being part of the structure of the fluid couplings, as opposed to being a separate component coupled thereto. Flow control mechanisms comprise valves, poppets, balls, gates, flappers, or other devices that block the flow of liquid coolant through the fluid coupling. For example, in FIG. 1A the fluid couplings 23, 26, 33, and 46 are shown with their flow control mechanisms open, and thus fluid can flow from the primary CDU 20 to the compute nodes 5 and back to primary CDU 20, as indicated by the dash-lined arrows in FIG. 1A. In contrast, in FIG. 1G, the fluid couplings 23, 26, 33, and 46 are shown with their flow control mechanisms closed, and thus fluid does not flow between CDU 20 and compute nodes 5.

Importantly, in addition to the infrastructure for coupling to the primary CDU 20 as already described above, the local supply path 30 and the local return path 40 of the computing system 6 also comprise maintenance ports configured to allow for the removable connection of a maintenance CDU 50 thereto. These maintenance ports comprise fluid couplings 35 and 44. The fluid coupling 35 is coupled to the supply manifold 31, directly or via one or more intermediate pipes or tubes 34. Similarly, fluid coupling 44 is coupled to the return manifold 41, directly or via one or more intermediate pipes or tubes 43. The fluid couplings 35 and 44 are configured to removably mate with corresponding fluid couplings 55 and 54, respectively, of a maintenance CDU 50 when the maintenance CDU 50 is positioned in an installed position (e.g., adjacent to the compute nodes 5). The fluid couplings 55 and 54 of the maintenance CDU 50 are connected directly or via intermediate pipes or tubes (not illustrated) to the maintenance CDU 50. The fluid couplings 55 and 54 may be referred to herein as system-side couplings because they are to couple to the local system of compute nodes 5. Moreover, fluid couplings 55 and 54 of the maintenance CDU 50 are fluidically coupled to one another via a flow path through the maintenance CDU 50, which extends through one side of the heat exchanger thereof. Thus, when maintenance CDU 50 is in an installed position and connectors 35 and 55 and connectors 54 and 44 are connected (and flow controls are open) a flow path is formed from local return path 40 to local supply path 30 through the heat exchanger of the maintenance CDU 50. The fluid couplings 35, 44, 54, and 55 may be referred to herein as a second set of fluid couplings.

The fluid couplings 35, 44, 55, and 54 comprise quick-disconnect fluid couplings. Valves or other flow control mechanisms may also be provided in association with the fluid couplings 35, 44, 55, and 54 to control the flow of liquid therethrough, which may be integral to the fluid couplings 35, 44, 55, and 54 or separate therefrom; for example, in FIG. 1, the fluid couplings 35, 44, 55, and 54 themselves have integral flow control mechanisms that can stop fluid movement, for example to prevent flow when they are disconnected. For example, in FIG. 1F the fluid couplings 35, 44, 55, and 54 are shown with their flow control mechanisms open, and thus fluid can flow from the maintenance CDU 50 to the compute nodes 5 and back to maintenance CDU 50, as indicated by the dash-lined arrows in FIG. 1F. In contrast, in FIG. 1B, the fluid couplings 35, 44, 55, and 54 are shown with their flow control mechanisms closed, and thus fluid does not flow between maintenance CDU 50 and compute nodes 5.

In FIG. 1, the fluid couplings 35 and 44 are shown as being coupled to the supply and return manifolds 31 and 41 on opposite sides from the fluid couplings 33 and 46, but it should be understood that this depiction is not intended to limit the actual positioning of the fluid couplings 33, 35, 44, and 46 relative to one another or relative to the supply and return manifolds 31 and 41. FIG. 1 comprises a schematic diagram and is not intended to illustrate the actual sizes, shapes, positions, or other structural details of the various parts. In practice, the fluid couplings 33, 35, 44, and 46 may be positioned in any manner that is convenient as long as it achieves the equivalent fluidic operation. For example, in some implementations the fluid couplings 33 and 35 are both coupled to the supply manifold 31 via a common path, such as an intermediate pipe or other component that is common to both. This may be enabled by use of a junction, such as a T-junction, Y-junction, or other junctions, that combines the two fluid couplings 33 and 35 to the common path. As another example, in other implementations fluid couplings 33 and 35 are connected to supply manifold 31 via wholly separate paths, such as separate intermediate pipes (such as pipes 32 and 34 in FIG. 1). As another example, in some implementations, one or both fluid couplings 33 and 35 are directly coupled to supply manifold 31 without any intermediate pipe. Similar variations in connectivity as those described above may be used for the fluid couplings 44 and 46 and the return manifold 41.

The system 1 also comprises a facility or system-wide cooling medium. In FIG. 1, the facility or system-wide cooling medium comprises facility liquid coolant as supplied by a facility supply line 10 and as returned by a facility return line 11. The facility supply line 10 and facility return line 11 may be part of a facility or system-wide cooling loop that may comprise, for example, pumps to cause the facility liquid coolant to flow, chillers or other cooling devices to remove heat from the facility liquid coolant, and other infrastructure as would be familiar to those of ordinary skill in the art.

In examples in which the facility or system-wide cooling medium is facility liquid coolant, the primary CDU 20 is fluidically coupled to the facility supply line 10 and the facility return line 11 via a third set of fluid couplings 14, 15, 24, and 25 so that the facility liquid coolant can flow through the primary CDU 20 to remove heat therefrom. In such examples, the primary CDU 20 may comprise a liquid-to-liquid heat exchanger that transfers heat from liquid coolant used locally to cool the group of compute nodes 5 into the facility liquid coolant. Specifically, the primary CDU 20 is coupled to the facility supply line 10 via fluid couplings 14 and 24 and to the facility return line 11 via fluid couplings 15 and 25. Fluid coupling 14 is connected to facility supply line 10 (e.g., directly or via an intermediate pipe or tubing 12), fluid coupling 24 is connect to primary CDU 20 (e.g., directly or via an intermediate pipe or tubing (not illustrated)), and the fluid couplings 14 and 24 are coupled together. Similarly, fluid coupling 15 is connected to facility return line 11 (e.g., directly or via an intermediate pipe or tubing 13), fluid coupling 25 is connect to primary CDU 20 (e.g., directly or via an intermediate pipe or tubing (not illustrated)), and the fluid couplings 15 and 25 are coupled together. Fluid couplings 24 and 25 are fluidically coupled to one another via a flow path through the primary CDU 20, which extends through one side of the heat exchanger thereof, which may be referred to as a facility side. Thus, when connectors 14 and 24 and connectors 15 and 25 are connected (and flow controls are open) a flow path is formed from facility supply line 10 to facility return line 11 through the heat exchanger of the primary CDU 20.

In some examples, the fluid couplings 14, 15, 24, and 25 comprise quick-disconnect couplers that allow for easier removal of the primary CDU 20 (e.g., if the primary CDU needs replacement). In other examples, the fluid coupling 14, 15, 24, and 25 may be more permanent couplings. Any type of fluid coupling mechanism may be used. Valves or other flow control mechanisms may also be provided in the flow path between the facility supply line 10 and the facility return line 11; for example, in FIG. 1, the fluid couplings 14, 15, 24, and 25 themselves have integral flow control mechanisms that can stop fluid movement, for example to prevent flow when they are disconnected. For example, in FIG. 1A the fluid couplings 14, 15, 24, and 25 are shown with their flow control mechanisms open, and thus fluid can flow from the facility supply line 10 through the primary CDU 20 to the facility return line 11, as indicated by the dash-lined arrows in FIG. 1A. In contrast, in FIG. 1G, the fluid couplings 14, 15, 24, and 25 are shown with their flow control mechanisms closed, and thus fluid does not flow from the facility supply line 10 through the primary CDU 20 to the facility return line 11.

In other examples (not illustrated), the facility or system-wide cooling medium may comprise air. For example, some facilities may use fans or other air moving devices to provide cooled air to the various devices in the system 1 and to remove heated air exhausted by such devices. In such examples, the primary CDU 20 may comprise a liquid-to-air heat exchanger (e.g., a radiator) configured to draw in the cooled air, transfer heat from the liquid coolant used to cool the group of compute nodes 5 into the air, and exhaust the heated air. In such examples, fluid couplings 14, 15, 24, and 25 and facility supply and return lines 10 and 11 may be omitted, and air moving devices and/or air guide structures (e.g., ducts, baffles, etc.) may be added to as would be familiar to those of ordinary skill in the art. For example, in some implementations, a facility may be divided into cool air zones (e.g., a cool air aisle) in which the cooled air is supplied and hot air zones (e.g., a hot air aisle) into which the heated air is exhausted, and cool air supply ducts and heated air return ducts may be arranged accordingly.

Returning to examples in which the facility cooling medium is liquid, such as the example shown in FIG. 1, the facility supply and return lines 10 and 11 may also be provided with maintenance ports to allow for the maintenance CDU 50 to be temporarily coupled thereto, much like the maintenance ports of the computing system 6 described above. These maintenance ports may comprise fluid couplings 17 and 18 coupled respectively to facility supply and return lines 10 and 11. The maintenance CDU 50 may comprise fluid couplings 57 and 58 to removably couple the maintenance CDU 50 to the facility supply and return lines 10 and 11 via these fluid couplings 17 and 18. In particular, fluid coupling 17 may be coupled to the facility return line 11 directly or via an intermediate pipe or tube 16, while fluid coupling 18 may be coupled to the facility supply line 10 directly or via an intermediate pipe or tube 19. Similarly, fluid couplings 57 and 58 are coupled to maintenance CDU 50 directly or via an intermediate pipe or tube (not illustrated). Fluid couplings 57 and 58 are also fluidically coupled to one another via the heat exchanger inside of the maintenance CDU 50. Thus, when maintenance CDU 50 is in an installed position and connectors 58 and 18 and connectors 57 and 17 are connected (and flow controls are open) a flow path is formed from facility supply line 10 to facility return line 11 through the heat exchanger of the maintenance CDU 50. The fluid couplings 17, 18, 57, and 58 may also be referred to herein as a fourth set of fluid couplings. The couplings 57 and 58 may be referred to herein as facility-side couplings because they couple to the facility supply and return lines 10 and 11.

The fluid couplings 17, 18, 57, and 58 comprise quick-disconnect fluid couplings. Valves or other flow control mechanisms may also be provided in association with the fluid couplings 17, 18, 57, and 58 to control the flow of liquid therethrough, which may be integral to the fluid couplings 17, 18, 57, and 58 or separate therefrom; for example, in FIG. 1, the fluid couplings 17, 18, 57, and 58 themselves have integral flow control mechanisms that can stop fluid movement, for example to prevent flow when they are disconnected. For example, in FIG. 1F the fluid couplings 17, 18, 57, and 58 are shown with their flow control mechanisms open, and thus fluid can flow from the facility supply line 10 to facility return line 11 via maintenance CDU 50, as indicated by the dash-lined arrows in FIG. 1F. In contrast, in FIG. 1B, the fluid couplings 17, 18, 57, and 58 are shown with their flow control mechanisms closed, and thus fluid does not flow between maintenance CDU 50 and compute nodes 5.

In examples in which the facility cooling medium is air, the fluid couplings 17, 18, 57, and 58 can be omitted. Moreover, in such examples, the maintenance CDU 50 is provided with a liquid-to-air heat exchanger, similar to that described above already in relation to the primary CDU 20.

As already mentioned to above, the maintenance CDU 50 can be removably fluidically coupled to the computing system 6, which is also referred to herein as an installed state of the maintenance CDU 50. When installed, the maintenance CDU 50 can be caused to the supply liquid coolant to the compute nodes 5 in lieu of the primary CDU 20. Thus, the maintenance CDU 50 can be used to take over providing cooling capacity to the computing system 6 from the primary CDU 20, thus allowing the primary CDU 20 to be taken offline (e.g., for planned maintenance or upgrade) without needing to turn off the compute nodes 5. Or, if the compute nodes 5 have already been turned off due to a failure of the primary CDU 20, the use of the maintenance CDU 50 may allow for the compute nodes 5 to be return to service sooner, for example while waiting for the primary CDU 20 to be repaired or replaced. The maintenance CDU 50 can be installed in the computing system 6 in a state in which the primary CDU 20 is also currently coupled to the computing system 6—in other words, the maintenance CDU 50 is not merely a replacement for the primary CDU 20, but rather can be installed while the primary CDU 20 is still in use. This may beneficially allow for a seamless transition between the primary CDU 20 supplying liquid cooling to the maintenance CDU 50 supplying liquid cooling, without having to go through a time in which no liquid cooling is supplied (as might otherwise be the case if the primary CDU were merely being replaced with the maintenance CDU). FIGS. 1A-1G illustrate various aspects of such installation of the maintenance CDU 50, which will be described in greater detail below.

FIG. 1A illustrates an uninstalled state in which the maintenance CDU 50 is not installed to service the computing system 6. In this state, the maintenance CDU 50 is not in an installed position adjacent to the computing system 6 and the fluid couplings 35 and 55 and fluid couplings 44 and 54 are not connected to one another. Similarly, in examples with facility liquid cooling, the fluid couplings 18 and 58 and fluid couplings 18 and 57 are also not coupled to one another. This state may correspond to the normal state of the system 1 in which everything is operating correctly, with the primary CDU 20 providing cooling to the compute nodes 5. Or this state may correspond to an initial state after a failure of the primary CDU 20 but before the maintenance CDU 50 has been installed to temporarily take over for the primary CDU 20.

In response to a failure occurring in the primary CDU 20 that causes the primary CDU 20 to cease operation or requires the primary CDU 20 to be taken offline for repair or replacement, or in response to planned downtime for the primary CDU 20 (e.g., for maintenance, upgrade, etc.), the maintenance CDU 50 may be moved into an installed position adjacent to the computing system 6, as shown in FIG. 1B. In the installed position, the fluid couplings 44 and 54 are aligned and the fluid couplings 35 and 55 are aligned. Similarly, the fluid couplings 18 and 58 are aligned (if present) and the fluid couplings 17 and 57 are aligned (if present). The maintenance CDU 50 is portable, and thus can be moved into and out of the installed position relatively freely. In some examples, the maintenance CDU 50 may comprise features that facilitate easier repositioning of the maintenance CDU 50, such as wheels, skids, or other mobility mechanisms to allow for easier motion, handles to facility easier manual manipulation, or other such features. In some examples, the maintenance CDU 50 may be smaller and/or lighter than a primary CDU 20, to facilitate easier movement. In some examples, the maintenance CDU 50 may comprise, or may be used with, a cart, track, sled, or other mobility system (powered or unpowered) that can aid in moving the maintenance CDU 50 about. In some examples, some or all of the fluid couplings 17, 18, 44, 35, 54, 55, 57 and 58 are coupled to flexible tubes (not illustrated) that allow for repositioning the fluid couplings within a limited range, and thus in such examples there may be a range of positions in which the maintenance CDU 50 may be disposed relative to computing system 6 while still being able to couple fluid couplings 17, 18, 44, 35, 54, 55, 57 and 58. Thus references herein to the installed position should be understood as including a range of installed positions. In other examples, the positions of fluid couplings 17, 18, 44, 35, 54, 55, 57 and 58 may be more rigidly fixed relative to the components they are respectively coupled to, in which case there may be a single installed position (or very limited range of positions) at which the maintenance CDU 50 can be installed while still being able to couple fluid couplings 17, 18, 44, 35, 54, 55, 57 and 58. In FIG. 1B, the maintenance CDU 50 and primary CDU 20 are shown on opposite sides of the computing device 6 for ease of illustration, but it should be understood that this is a conceptual diagram and that relative positions, sizes, shapes, and the like are not shown therein. In practice, the installed position of the maintenance CDU 50 can be anywhere that is convenient according to the configuration and constraints of the system.

Once the maintenance CDU 50 is positioned adjacent the computing system 6 in the installed position, the fluid couplings 17, 18, 44, 35, 54, 55, 57 and 58 may be connected together, and the flow control elements associated therewith may be opened, to fluidically couple the maintenance CDU 50 to the compute nodes 5 and, in examples where relevant, to the facility supply and return lines 10 and 11. In some examples, the act of connecting two fluid couplings together also causes the flow control elements associated therewith to automatically open, and conversely disconnecting those fluid couplings causes their flow control elements to automatically close. For example, spring or pressure loaded poppets inside the fluid couplings may be depressed by complementary protrusions of the other fluid coupling during the mating thereof, thus opening the fluid paths, whereas when the fluid couplings are disconnected the spring force or fluid pressure may push the poppet into a closed position in which it blocks the fluid path. In other examples, the flow control elements may be actuatable independently of the connection of the fluid couplings. For example, the flow control elements may include a valve inside the fluid coupling that is actuatable by manually moving a lever.

In some examples, an order of opening the flow controls associated with the fluid couplings 17, 18, 44, 35, 54, 55, 57 and 58 may be important, for example to avoid spills and/or damage to parts. FIGS. 1C-1G illustrate an example sequence for opening the flow controls of the fluid couplings 17, 18, 44, 35, 54, 55, 57 and 58. In examples in which the flow control mechanisms of the fluid couplings 17, 18, 44, 35, 54, 55, 57, and 58 are automatically opened in response to the fluid couplings being coupled, the sequence of opening the fluid couplings 17, 18, 44, 35, 54, 55, 57, and 58 is one-and-the-same as the sequence of establishing connections between fluid couplings 17, 18, 44, 35, 54, 55, 57 and

58. In other examples, the fluid couplings 17, 18, 44, 35, 54, 55, 57, and 58 can be coupled together in any order and then the flow control elements thereof can be manual actuated in the desired sequence.

Figure 1C:
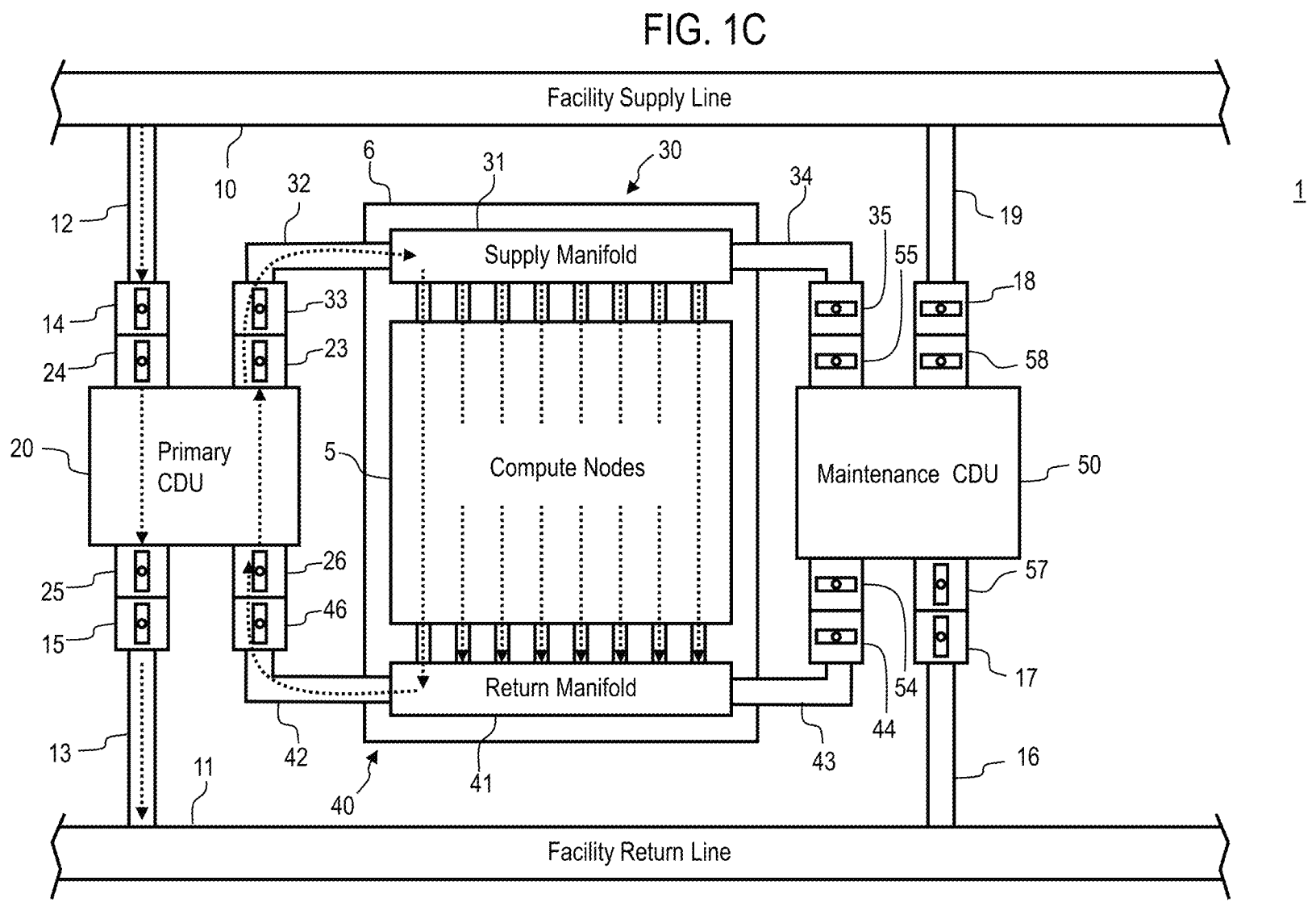
Figure 1D:
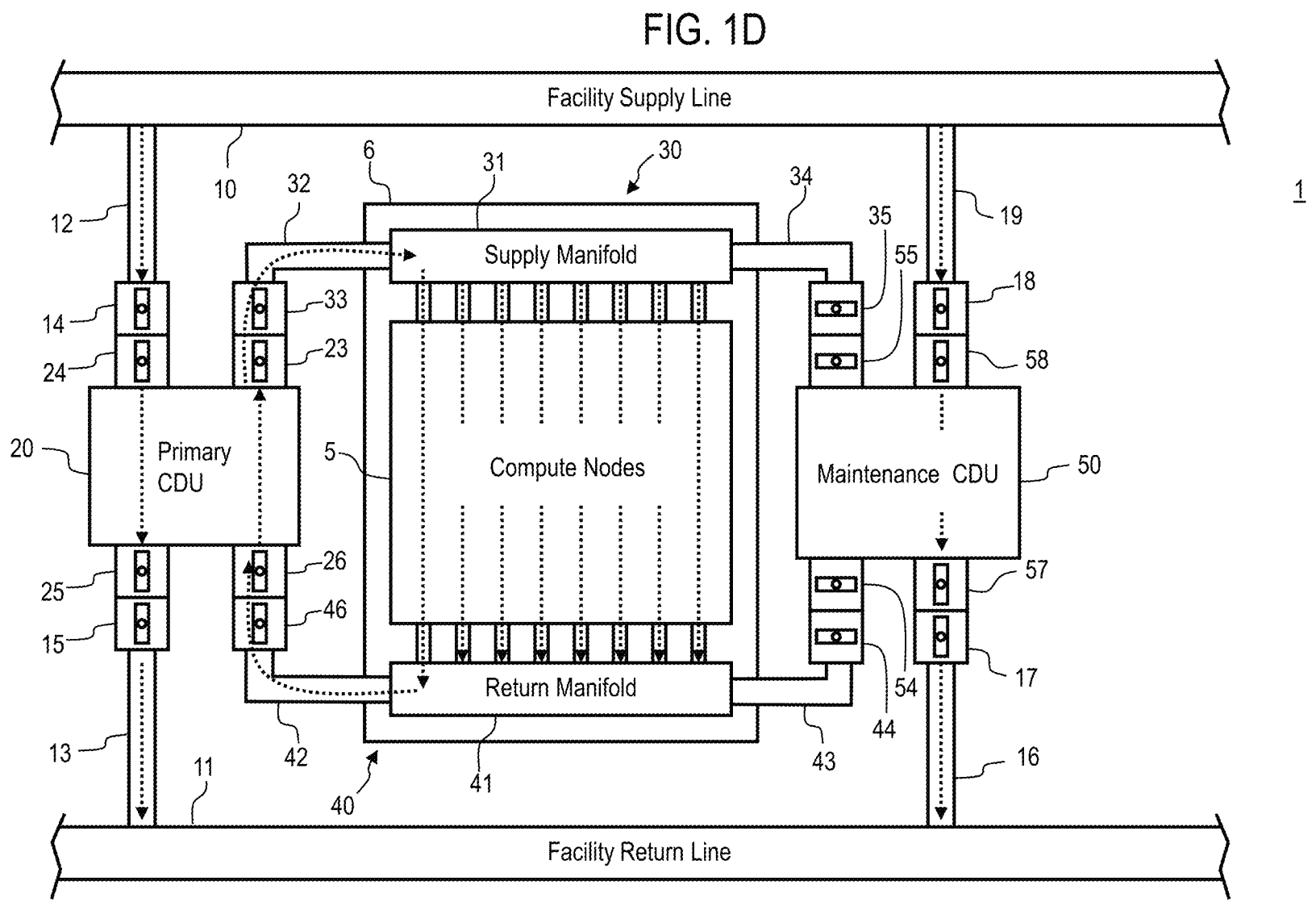

In one example, the flow controls associated with the fluid couplings 17 and 57 may be opened first, as shown in FIG. 1C. This connects the facility return 11 (which may be at low pressure relative to the facility supply line 10) to the maintenance CDU 50. Next, as shown in FIG. 1D, the flow controls associated with the fluid couplings 18 and 58 may be opened. This connects the facility supply 10 to maintenance CDU 50. Because fluid couplings 17 and 57 have already been opened, upon opening of fluid couplings 18 and 58 a liquid coolant can flow from facility supply line 10 through maintenance CDU 50 to facility return line 11. In examples in which the facility cooling medium is air instead of liquid coolant, the operations of FIGS. 1C and 1D may be omitted, and in lieu of these operations the fans associated with the liquid to air heat exchanger of the maintenance CDU may be turned on (if they are not already on).

Figure 1E:
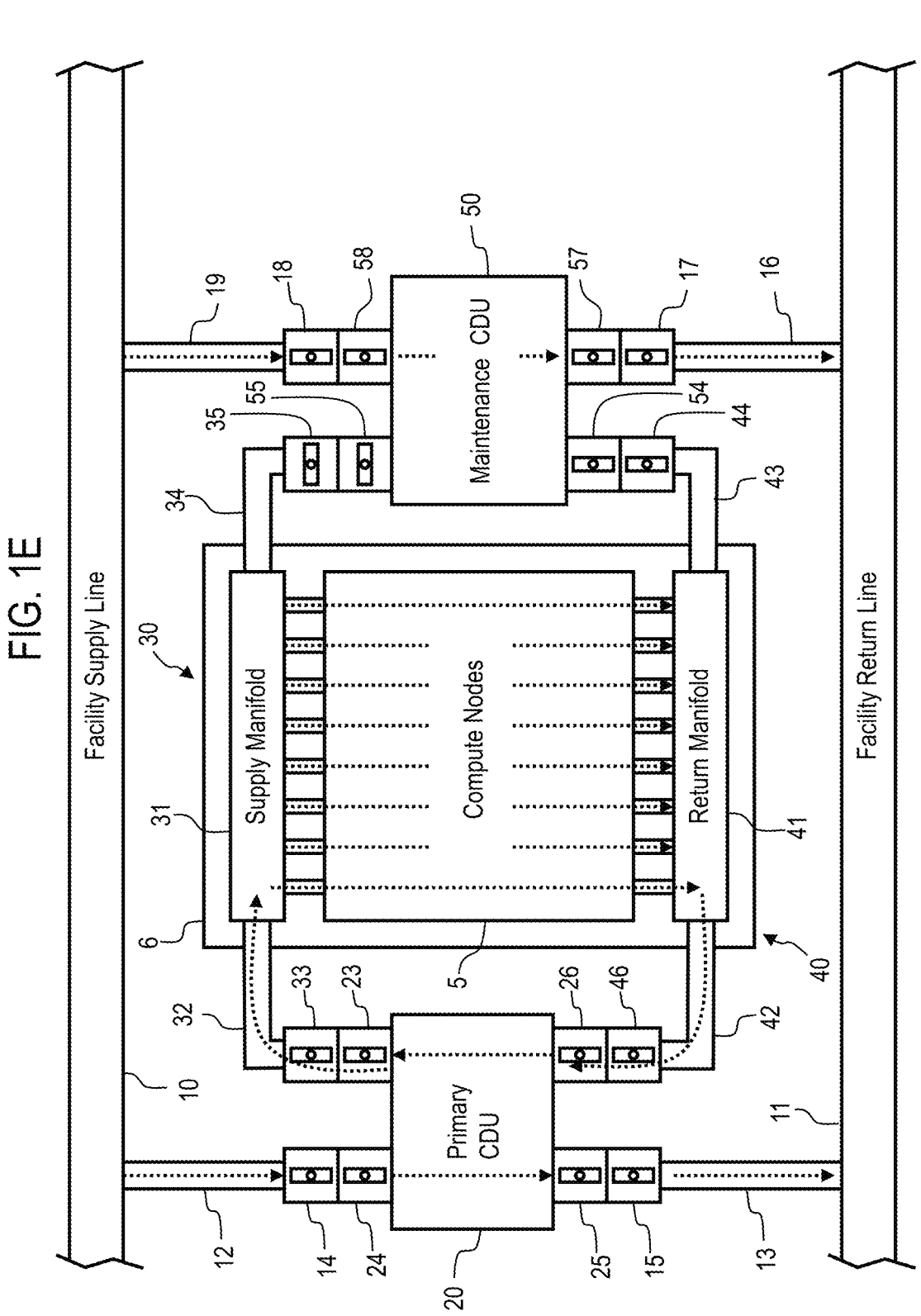
FIG. 1E is a block diagram illustrating the example system in a fifth state.
Figure 1F:
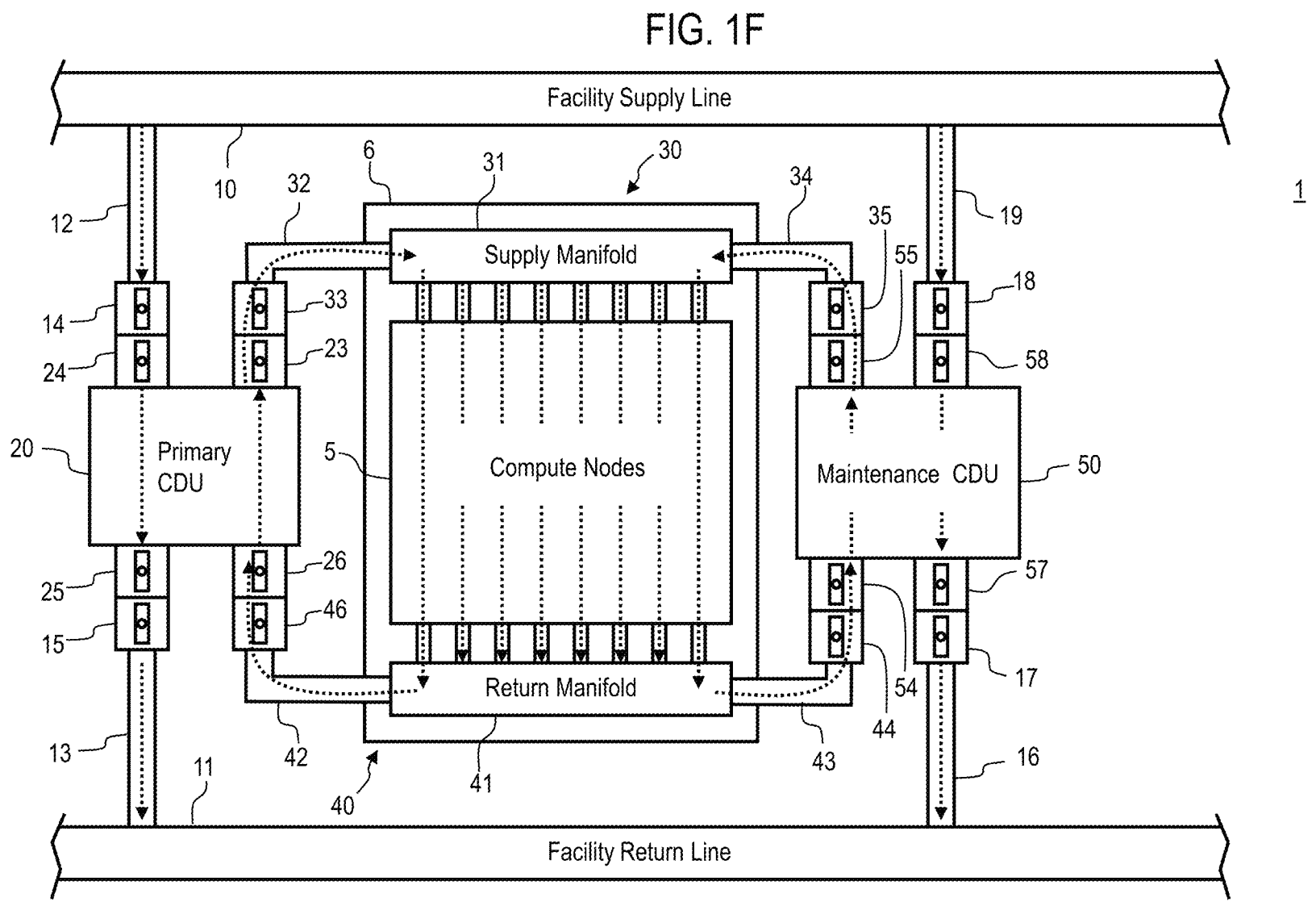

As shown in FIG. 1E, the next flow control that may be opened comprises the flow control elements associated with the fluid couplings 44 and 54. This connects the return manifold 41 (which, during operation, is at low pressure relative to the supply manifold 31) to the maintenance CDU 50. Next, as shown in FIG. 1F, the flow control elements associated with the fluid couplings 55 and 35 may be opened. This connects the supply manifold 31 to maintenance CDU 50. Because fluid couplings 44 and 54 have already been opened, upon opening of fluid couplings 35 and 55, a flow path is established between supply and return manifolds 31 and 41 via maintenance CDU 50. Pumps within CDU 50 may then be turned on, which causes liquid coolant to flow through the CDU 50 to the supply manifold 31, as illustrated in FIG. 1F. In this state, the maintenance CDU 50 is ready to take over pumping and cooling the liquid coolant for the primary CDU 20. Thus primary CDU 20 can now be turned off (if it is still operational).

Figure 1G:
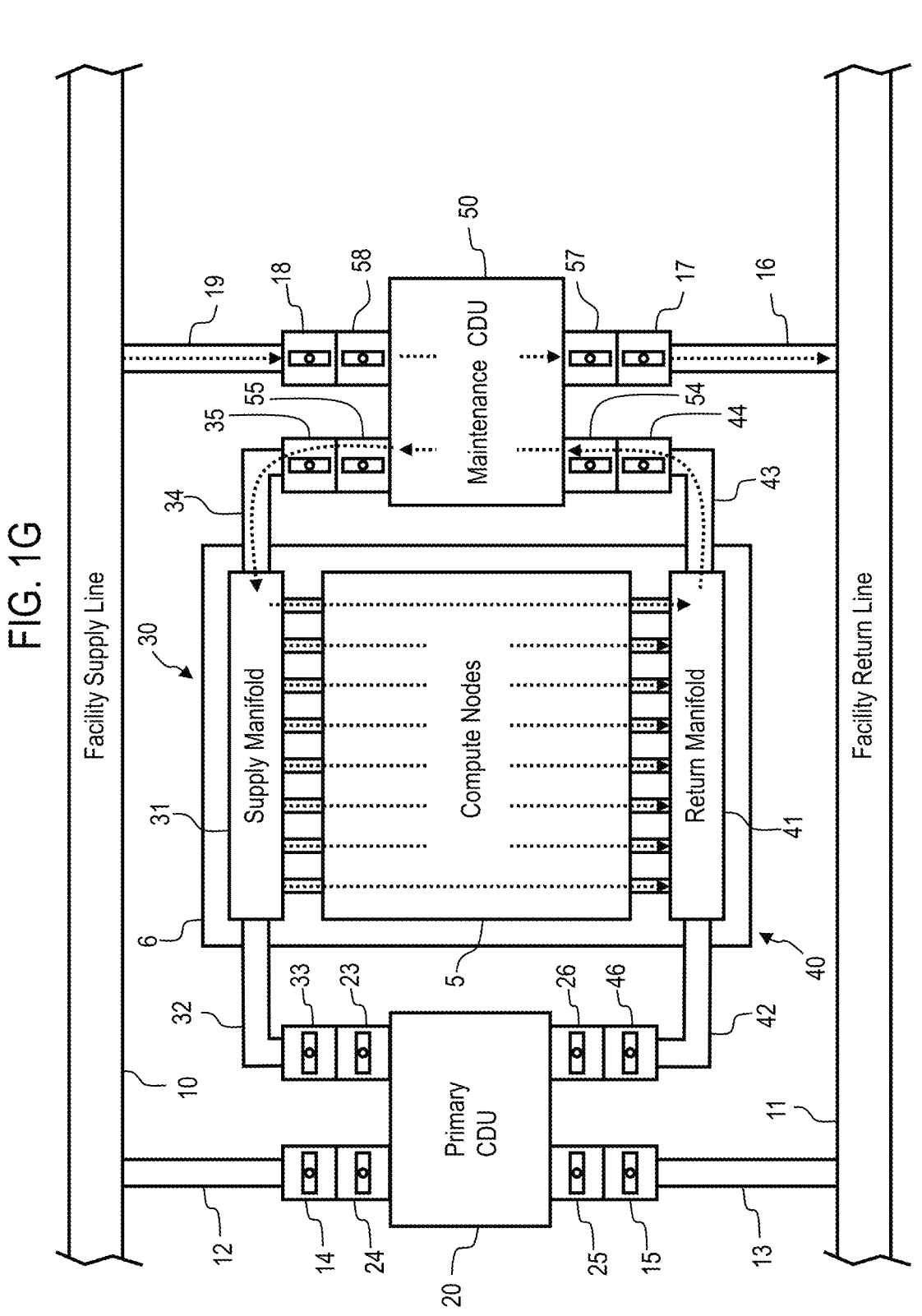
FIG. 1G is a block diagram illustrating the example system in a seventh state.

Next, as shown in FIG. 1G, the primary CDU 20 may be isolated from computing system 6 and from facility supply and return lines 10 and 11 by closing the flow control elements associated with the fluid couplings 14, 15, 23, 24, 25, 26, 33, and 46. In some examples, this may involve disconnecting the fluid couplings 14, 15, 23, 24, 25, 26, 33, and 46. In other examples, the fluid couplings 14, 15, 23, 24, 25, 26, 33, and 46 may remain connected and valves or other manually operable flow control elements may be closed. The CDU 20 can now be removed from the system if needed (e.g., for servicing or replacement) or the CDU 20 can be serviced in place.

Once the primary CDU 20 is ready to come back online (e.g., the service has been completed and/or the primary CDU 20 has been replaced), the above sequence may be reversed to reconnect the primary CDU 20 and to disconnect the maintenance CDU 50. Once the maintenance CDU 50 is disconnected, it can be moved away from the installed position. For example, the maintenance CDU 50 can be moved to another computing system 6 whose CDU 20 needs downtime, or if no other CDU's 20 currently need downtime the maintenance CDU 50 may be returned to a storage location to await being deployed again. Thus, the maintenance CDU 50 may be moved about the facility to provide temporary support to various computing systems 6 as and where needed.

In some examples, the maintenance CDU 50 may comprise one or more pumps and a heat exchanger, as well as various ancillary components (e.g., pipes, couplings, etc.).

The internal configurations of CDU's are known in the art, and thus are not illustrated herein in detail. The maintenance CDU 50 may also comprise, in some examples, a reservoir that is configured to hold a reserve volume of liquid coolant. The reserve volume of liquid coolant in the reservoir may allow the maintenance CDU 50 to be coupled to and decoupled from the group of nodes 5 without changing the overall volume of liquid coolant in the computing nodes 5, supply path 30, and return path 40.

Although only one computing system 6 is illustrated, it should be understood that the system 1 may comprise multiple computing systems 6, each having its own corresponding primary CDU 20. Moreover, the maintenance CDU 50 may be connected with each one of the computing systems 6 in the same manner as described above (not all at once, but rather one at a time). In this manner, a single maintenance CDU 50 may be useable with multiple computing systems 6, thus enabling downtime for the primary CDU's 20 thereof with minimal to no impact on the compute nodes 5 thereof.

Figure 2:
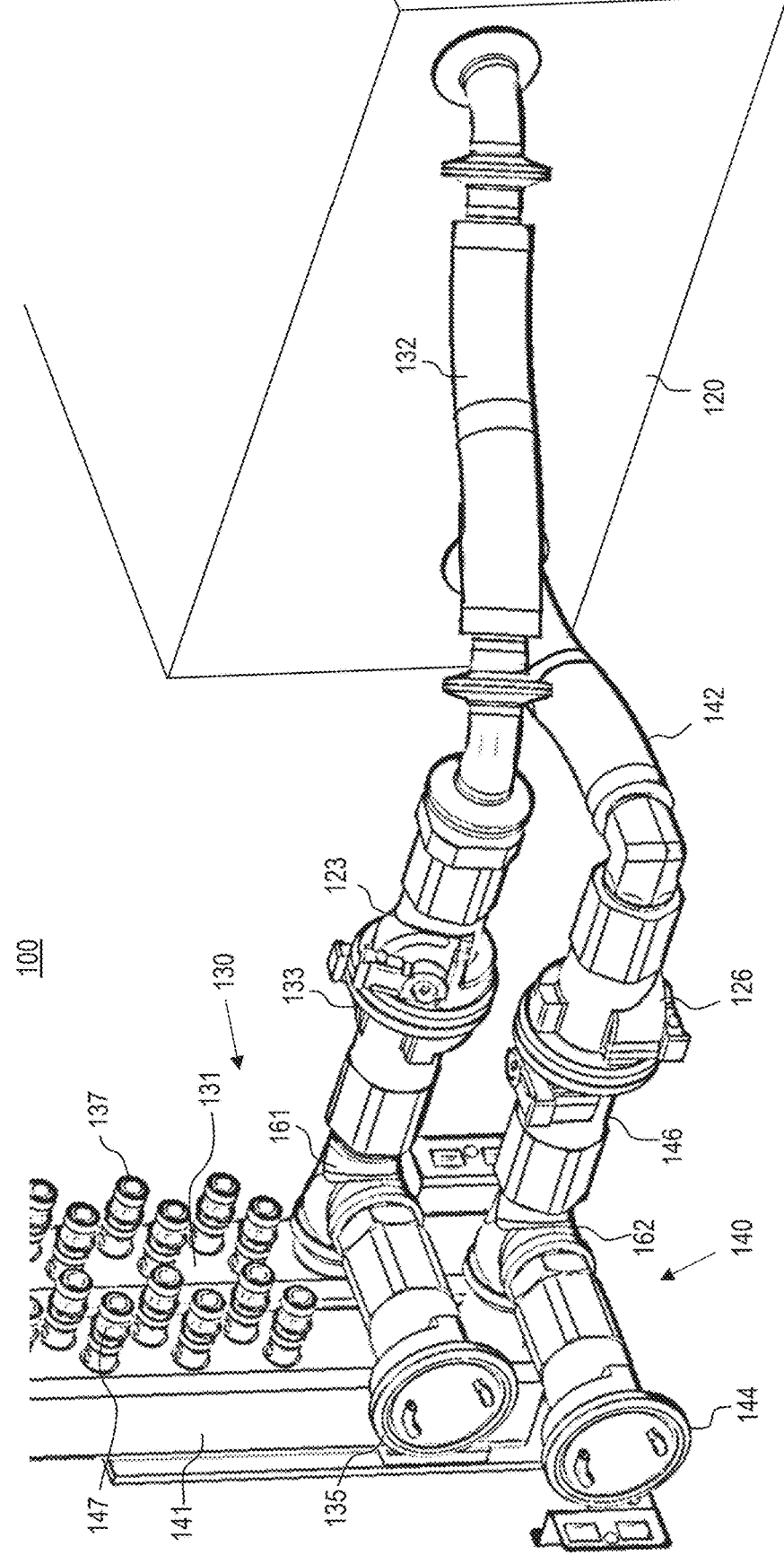
FIG. 2 is perspective view of example local supply and return paths of an example computing system.

FIG. 2 illustrates a portion of an example computing system 100, particularly an example of a local liquid cooling supply path 130 and a local liquid cooling return path 140 of the computing system 100. The local supply path 130 and a local return path 140 are configured to allow for removable coupling of a maintenance CDU (not illustrated) to the computing system 100. The computing system 100 is an example of the computing system 6 described above, and the supply and return paths 130 and 140 are example configurations of the supply and return paths 30 and 40 described above, respectively. The local supply path 130 comprises supply manifold 131, which is an example configuration of supply manifold 30. The supply manifold 131 comprises ports 137 to connect to compute nodes (directly or via intermediate pipes or tubes). The local supply path 130 also comprises fluid couplings 133 and 135 which are example configurations of fluid couplings 33 and 35 described above. The local supply path 130 further comprises a T-junction 161, which fluidically connects both of the fluid couplings 133 and 135 to a common fluid path, which is coupled to the supply manifold 131. Similarly, the local return path 140 comprises return manifold 141, which is an example configuration of return manifold 40, fluid couplings 144 and 146, which are example configurations of fluid couplings 44 and 46, and a T-junction 162, which fluidically connects both of the fluid couplings 144 and 146 to a common fluid path, which is coupled to the return manifold 141. The return manifold 141 comprises ports 147 to connect to compute nodes (directly or via intermediate pipes or tubes).

Fluid couplings 133 and 146 are coupled to fluid couplings 123 and 126. The fluid couplings 123 and 126 are example configurations of the fluid couplings 23 and 26, and are coupled to primary CDU 120 via pipes 132 and 142, respectively. The fluid couplings 123, 126, 133, and 146 form what may be referred to herein as a first set of fluid couplings.

The fluid couplings 135 and 144 are configured to mate with corresponding fluid couplings of a maintenance CDU (not illustrated), such as the maintenance CDU 20, to allow the maintenance CDU to be fluidically coupled to manifolds 131 and 141. The fluid couplings 135 and 144 may also be referred to herein as maintenance ports of the computing system 100. The fluid couplings 135 and 144, together with the fluid couplings of the maintenance CDU that couple therewith (not illustrated), may form what is referred to herein as the second set of fluid couplings.

The fluid couplings 133, 135, 144, 146, 123, and 126 comprise quick disconnect couplings that have integral flow control mechanisms that can be actuated to start or stop fluid flow, such as Eaton FD83 couplings.

Turning now to FIG. 3, an example method 300 will be described. The method 300 may be performed, for example, by an administrator, technician, or other person. The method 300 may be performed, for example, in response to a failure experienced at a primary CDU of a computing system. The method 300 may also be performed, for example, for a planned downtime of a primary CDU of a computing system.

The method 300 begins at block 302, wherein the technician moves a portable maintenance CDU into an installation position adjacent to a group of compute nodes (e.g., a rack or group of racks).

In block 304, the technician connects facility side fluid couplings of the maintenance CDU to maintenance ports of facility supply and facility return line. These maintenance ports may comprise, for example, the fluid couplings 17 and 18 described above. The facility side fluid couplings may comprise, for example, fluid couplings 57 and 58 described above. In addition, block 304 comprises opening the valves (or other control mechanisms) associated with the facility side fluid couplings and corresponding maintenance ports. In examples in which maintenance CDU comprises a liquid to air heat exchanger, block 304 may be omitted.

In block 306, the technician connects system-side fluid couplings of the maintenance CDU to maintenance ports of the supply and return paths of the local system of compute nodes. The system-side fluid couplings may comprise the fluid couplings 55 and 54 described above. The supply and return paths may comprise the supply and return paths 30 and 40 or 130 and 140 described above, and the maintenance ports thereof may comprise the fluid couplings 35 and 44 or 135 and 144 described above. In addition, block 306 comprises opening the valves (or other control mechanisms) associated with the system side fluid couplings and corresponding maintenance ports.

Blocks 304 and 306 may be performed in a state in which a primary CDU is already coupled to the computing system and to the facility supply and return lines by fluid couplings other than the aforementioned maintenance ports. In other words, the maintenance ports comprise ports that are not normally used by the primary CDU but which are used specifically for temporarily coupling the maintenance CDU to the system and/or to the facility supply and return lines.

In block 308, the technician closes the fluid paths between the primary CDU and the computing system and also the fluid path between the primary CDU and the facility supply and return lines. For example, valves or other flow control mechanisms in these fluid paths may be closed. In some examples, fluid couplings between the primary CDU and the system and facility supply/return lines may also be disconnected and the primary CDU may be removed. In other examples, the primary CDU may be serviced in place.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A system comprising:
   a plurality of computing systems, each comprising a group of compute nodes configured to receive liquid coolant;
   a plurality of primary coolant distribution units (CDUs), each fluidically coupled to a respective one of the plurality of computing systems via a first set of fluid couplings and configured to supply the liquid coolant to the respective one of the plurality of computing systems; and
   a portable maintenance CDU configured to be removably coupled to each of the plurality of computing systems, one at a time, in a state of a corresponding primary CDU still being coupled to a respective computing system, via a second set of fluid couplings,
   wherein the portable maintenance CDU is configured to supply the liquid coolant to the respective computing system in an installed state.

2. The system of claim 1,
   wherein the respective computing system further comprises:
   a supply path comprising a supply manifold fluidically coupled to the group of compute nodes, a first fluid coupling coupled to supply manifold and to the corresponding primary CDU, and a second fluid coupling coupled to the supply manifold; and
   a return path comprising a return manifold fluidically coupled to the group of compute nodes, a third fluid coupling coupled to the return manifold and to the corresponding primary CDU, and a fourth fluid coupling coupled to the return manifold; and
   wherein the first set of fluid couplings comprises the first fluid coupling and the third fluid coupling, and the second set of fluid couplings comprises the second fluid coupling and the fourth fluid coupling.

3. The system of claim 2,
   wherein the first fluid coupling and the second fluid coupling are coupled to a common fluid path via a junction.

4. The system of claim 2,
   wherein the third fluid coupling and the fourth fluid coupling are coupled to a common fluid path via a second junction.

5. The system of claim 1, further comprising:

a facility supply line configured to supply facility liquid coolant;

a facility return line configured to return facility liquid coolant;

a third set of fluid couplings coupling the corresponding primary CDU to the facility supply line and the facility return line; and a fourth set of fluid couplings configured to, in the installed state of the portable maintenance CDU, couple the portable maintenance CDU to the facility supply line and the facility return line.

6. The system of claim 5, wherein the first, second, third, and fourth set of fluid couplings comprise quick disconnect fluid couplings.

7. The system of claim 5, wherein the first, second, third, and fourth set of fluid couplings comprise integral flow control mechanisms.

8. The system of claim 5, wherein the corresponding primary CDU and the portable maintenance CDU each comprise liquid-to-liquid heat exchangers.

9. The system of claim 1, wherein the corresponding primary CDU and the portable maintenance CDU each comprise liquid-to-air heat exchangers.

10. A method comprising:

moving a portable maintenance cooling distribution unit (CDU) into an installation position adjacent to a computing system, wherein a primary CDU is fluidically coupled to the computing system via a first set of fluid couplings;

connecting the portable maintenance CDU to the computing system via a second set of fluid couplings, in a state of the primary CDU coupled to the computing system;

supplying liquid coolant to the computing system via the portable maintenance CDU;

moving the portable maintenance CDU into a second installation position adjacent to a second computing system, wherein a second primary CDU is fluidically coupled to the second computing system;

connecting the portable maintenance CDU to the second computing system, in the state of the primary CDU coupled to the computing system; and supplying the liquid coolant to the second computing system via the portable maintenance CDU.

11. The method of claim 10, wherein the primary CDU is coupled to a facility supply line and a facility return line via a third set of fluid couplings; and the method further comprises connecting the portable maintenance CDU to the facility supply line and the facility return line via a fourth set of fluid couplings.

12. The method of claim 10, wherein coupling to the computing system via the second set of fluid couplings, in the state of the primary CDU coupled to the computing system, comprises coupling system-side fluid couplings of the portable maintenance CDU to maintenance ports of supply and return paths of a local system of compute nodes.

13. The method of claim 10, wherein the computing system further comprises:

a supply path comprising a supply manifold fluidically coupled to a group of compute nodes, a first fluid coupling coupled to supply manifold and to the primary CDU, and a second fluid coupling coupled to the supply manifold; and a return path comprising a return manifold fluidically coupled to the group of compute nodes, a third fluid coupling coupled to the return manifold and to the primary CDU, and a fourth fluid coupling coupled to the return manifold; and the first set of fluid couplings comprises the first fluid coupling and the third fluid coupling, and the second set of fluid couplings comprises the second fluid coupling and the fourth fluid coupling, and wherein connecting the portable maintenance CDU to the computing system via the second set of fluid couplings comprises connecting the portable maintenance CDU to the second fluid coupling and to the fourth fluid coupling.

14. The method of claim 13, wherein the first fluid coupling and the second fluid coupling are coupled to a common fluid path via a junction; and wherein the third fluid coupling and the fourth fluid coupling are coupled to the common fluid path via a second junction.

15. The method of claim 10, further comprising:

disconnecting the portable maintenance CDU from the computing system; and moving the portable maintenance CDU out of the installation position.

16. A system comprising:

a plurality of computing systems, each comprising a group of compute nodes configured to receive liquid coolant;

a plurality of primary coolant distribution units (CDUs), each fluidically coupled to a respective one of the plurality of computing systems via a first set of fluid couplings and configured to supply the liquid coolant to the respective one of the plurality of computing systems; and a second set of fluid couplings configured to removably couple a portable maintenance CDU to each of the plurality of computing systems, one at a time, in a state of a corresponding primary CDU still being coupled to a respective computing system.

17. The system of claim 16, wherein the respective computing system further comprises:

a supply path comprising a supply manifold fluidically coupled to the group of compute nodes, a first fluid coupling coupled to supply manifold and to the corresponding primary CDU, and a second fluid coupling coupled to the supply manifold; and a return path comprising a return manifold fluidically coupled to the group of compute nodes, a third fluid coupling coupled to the return manifold and to the corresponding primary CDU, and a fourth fluid coupling coupled to the return manifold; and wherein the first set of fluid couplings comprises the first fluid coupling and the third fluid coupling, and the second set of fluid couplings comprises the second fluid coupling and the fourth fluid coupling.

18. The system of claim 17, wherein the first fluid coupling and the second fluid coupling are coupled to a common fluid path via a junction.

19. The system of claim 17, wherein the third fluid coupling and the fourth fluid coupling are coupled to a common fluid path via a second junction.

20. The system of claim 16, wherein the corresponding primary CDU and the portable maintenance CDU each comprise liquid-to-liquid heat exchangers.

\* \* \* \* \*